United States Patent [19]

Richards, Jr.

[11] Patent Number: 4,538,300
[45] Date of Patent: Aug. 27, 1985

[54] LINEAR SIGNAL STRENGTH DETECTOR IN AM RADIO

[75] Inventor: Oliver L. Richards, Jr., Windham, Conn.

[73] Assignee: Sprague Electric Company, North Adams, Mass.

[21] Appl. No.: 530,131

[22] Filed: Sep. 7, 1983

[51] Int. Cl.³ .......................... H03J 7/18; H04B 1/16
[52] U.S. Cl. .................................. 455/161; 455/200; 455/241; 455/245; 455/253; 330/254
[58] Field of Search ............... 455/161, 169, 219, 200, 455/234, 239, 240, 241, 242, 245, 247, 251, 253; 330/254, 278, 279

[56] References Cited
U.S. PATENT DOCUMENTS 3,569,840  3/1971  Tanaka ................................ 455/219
3,714,580  1/1973  Close .
4,134,078  1/1979  Arai et al. ........................... 330/254
4,172,239  10/1979  Harford ............................... 455/242
4,262,363  4/1981  Wiechmann et al. ............... 455/161
4,339,728  7/1982  Monticelli ........................... 330/254

Primary Examiner—Jin F. Ng

[57] ABSTRACT

An automatic scanning AM radio receiver includes an AGC and an AGC restorer circuit. The AGC circuit controls the gain or transconductance of a bipolar-transistor IF stage by varying the emitter bias current. The restorer comprises an amplifier with diode loads and has an input connected to a down stream point in the signal channel of the tandem connected IF stages. The load bias current is held proportional to an output of the AGC circuit. Thus the restorer output is proportional to the IF signal presented to the first IF stage, and is absent the delays, nonlinearities, undershoots and overshoots that are characteristic of the AGC circuit output.

7 Claims, 5 Drawing Figures

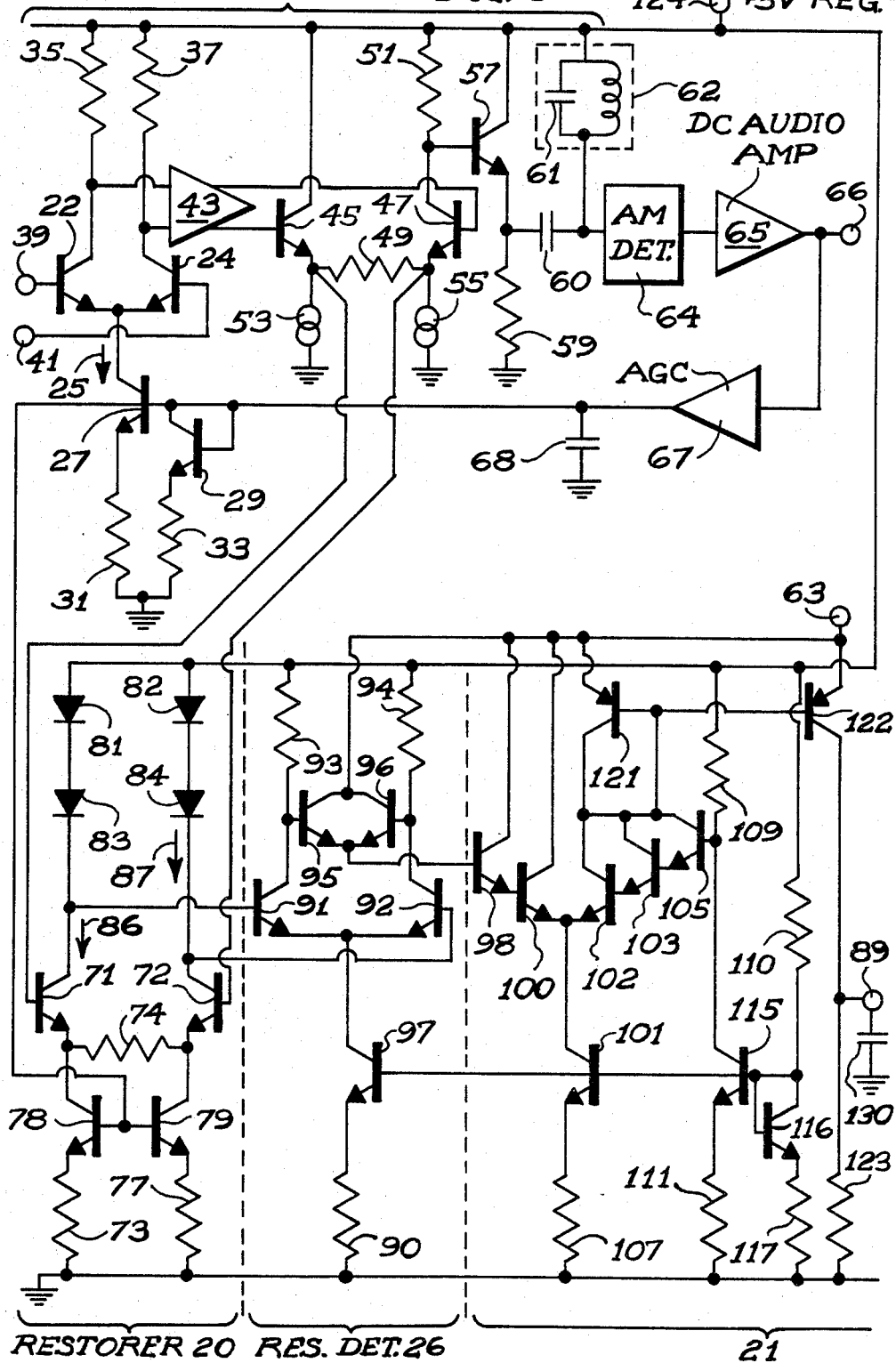

LINEAR SIGNAL STRENGTH DETECTOR IN AM RADIO

BACKGROUND OF THE INVENTION

This invention relates to a radio receiver having an automatic gain control (AGC) circuit, and more particularly relates to such a radio additionally having an AGC signal restorer circuit having an output linearly proportional to the signal strength of the incoming radio signal.

It is well known to employ an AGC circuit in a radio receiver to automatically adjust the gain in one or more of the amplifier stages so as to keep the radio output signal at about the same level while the amplitude of the incoming radio signal may vary several orders of magnitude. Thus the convenience and pleasure of the listener is enhanced while the signal levels in the stages under AGC influence (in the loop) is kept to within a linear range avoiding distortion such as that due to overloading or "saturating", or from another view, making the construction of such stages simpler and less costly.

In an AM, superheterodyne receiver, such as that illustrated in FIG. 1, the DC component of the output signal from a simple rectifier-type AM detector is proportional to the amplitude of the IF carrier at the output of the IF amplifiers. That DC component is typically transformed into a suitable signal for controlling the gain of at least one or more IF stages and the AGC feedback loop includes the IF stage(s), the detector and the AGC circuit.

Thus the AGC circuit insures that the range of signal amplitudes that need to be handled without distortion in the IF amplifier, detector and audio amplifier, is quite small and consequently the design of these circuits is made less critical and more economical.

When the radio includes a signal strength meter, the meter is usually driven by the AGC circuit. However, such an arrangement usually leads to quite a nonlinear meter response with respect to the amplitude of the IF input signal because, owing to nonlinearities in the AGC circuit that is relatively insensitive at moderate to large signal levels, the DC level at the input of the AGC circuit has a nonlinear relationship with the magnitude of the incoming IF signal as illustrated by curve 11 in FIG. 2. When a more precise measure of incoming signal strength is wanted, a DC signal having a linear relationship with the incoming signal would be desirable.

Of course one could derive such a desired signal by simply duplicating those parts of the radio, (e.g. IF, detector and audio amplifier) but without an AGC. However, this would lead to high costs especially since without AGC the range of amplitudes that those stages must handle is large and their design would be more critical and complex.

When the radio employs an automatic scan-tuning means for scanning and stopping at a strong station, the AGC signal typically serves also as the scan-stop signal. By their very nature AGC siganls of AM radios incorporate substantial delay, overshoot and/or undershoot in response to a fast change in amplitude of the radio signal. Thus the tune-scanning rate must be kept low in order to avoid lock-up on strong stations and skipping moderately strong stations. Such scanners typically take no less than 15 seconds to scan the AM broadcast band, which is much slower than desired. In general the speed of response of the AGC circuit in an AM receiver is no greater than can be developed from sub-audible frequencies whereas by contrast, the response of the AGC circuit in an FM receiver is limited only by the band width of the IF amplifier.

Therefore, an object of the present invention is to provide in a radio receiver capable of operation in an analogue gain mode, such as an AM radio receiver, an economical means for producing a monitoring signal that is proportional to the amplitude of an incoming radio signal.

It is a further object of this invention to provide in a scan-tuning AM radio, an economical means for providing a stop signal to the scan-tuning circuit that does not include the delays, overshoot, undershoot and nonlinearities of the AGC circuit.

SUMMARY OF THE INVENTION

A radio receiver of the kind that is capable of operating in an analog-gain mode, e.g. an AM radio, is comprised of a plurality of tandem-connected analog-amplifier stages for processing and amplifying a radio signal, and an AGC circuit for automatically controlling the gain of at least the first of the tandem stages to maintain the output signal level from those stages substantially constant for a wide range of amplitudes of the radio signal coming into those stages. In addition, a restorer circuit has an input connected to a point in the signal channel of the tandem stages. A means is also provided for altering the gain of the restorer circuit to make inverse, i.e. complementary, the restorer circuit gain and the gain of the portion of the tandem stages lying between the first stage input and the above-noted point at which the restorer input is connected. Thus, the product of these gains is constant, and the restorer output is fixed relative to the magnitude of the incoming radio signal.

It is preferred that the radio be a superheterodyne receiver including one or more IF stages wherein the first IF stage is the above-noted first tandem stage. Alternatively, an RF stage or the mixer stage may serve the role of the first tandem stage.

An integrated circuit realization of such a radio allocates less than ten percent of the silicon real estate, i.e. area, and adds only one discrete component, i.e. a capacitor, to form the restorer circuit; and provides a voltage at the output of the restorer that is proportional to the magnitude of the incoming radio signal for many orders of magnitude of radio signal strength. The restorer output signal may be used, for example, to provide a more sensitive and more reliable stop signal for stopping an automatic scan-tuner.

BRIEF DESCRIPTION OF THE DRAWINGS

FIG. 4 shows a simplified hybrid circuit-and-block-diagram of the key portion of the radio receiver of FIG. 3.

DESCRIPTION OF THE PREFERRED EMBODIMENTS

Figure 3:
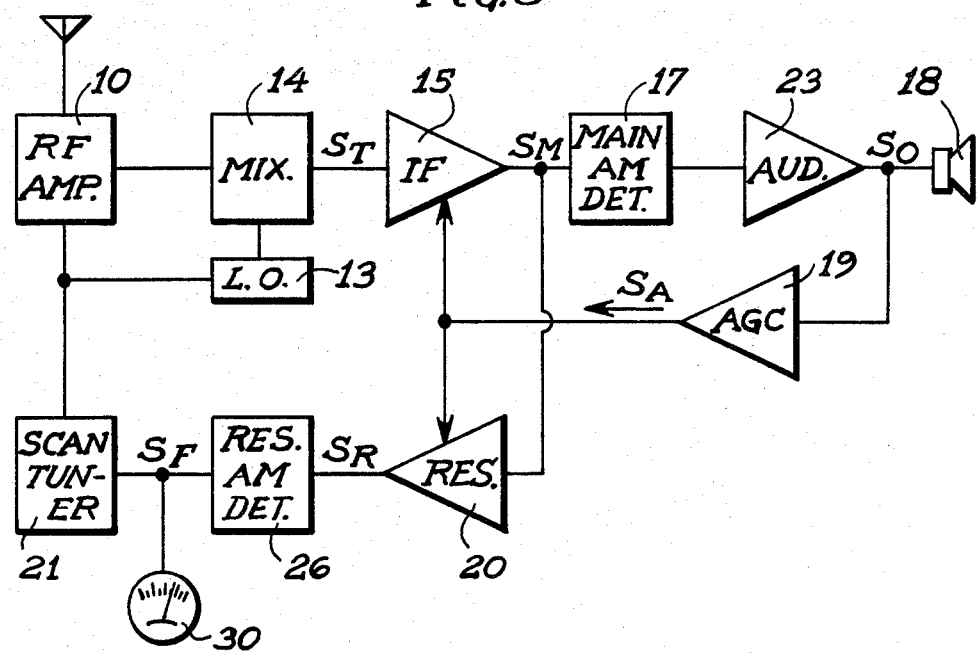
FIG. 3 shows a block diagram representing a preferred embodiment of this invention including a portion of a conventional AM radio receiver with a restorer circuit of this invention.

The superheterodyne AM radio receiver shown in FIG. 3 includes electronically tunable RF amplifier 10 and oscillator 13, a mixer 14, the IF amplifier 15, AM detector 17, AGC circuit 19, a restorer circuit 20 and a scan-tuner circuit 21. An audio amplifier 23 and speaker 18 are also shown.

The purpose of the restorer circuit 20 is to provide an output signal $S_R$ or $S_F$ that is proportional to the incoming signal $S_T$. The DC component of the output signal $S_O$ from audio amplifier 23 would have had a linear relationship with incoming signal $S_T$ if the AGC circuit had not been included in the radio, assuming the IF and other radio stages remained linear.

In the preferred embodiment, depicted in FIG. 4, the transfer function $f_1 = |S_R|/|S_M|$ of the restorer circuit 20 is made complementary to the transfer function $f_2 = |S_M|/|S_T|$ of the IF amplifier 15. Of course $|S_M|$ is proportional to $|S_O|$. Thus the product $f_1 \cdot f_2$ equals to a constant so that $|S_R|$ is proportional to $|S_T|$.

Since in this embodiment the restorer is amplifying IF signals, namely $S_M$, it is convenient to rectify the output $S_R$ of the restorer 20 in the following detector 26 to provide a DC voltage (or current) that can serve as the stop signal to the scan-tuner 21 and will drive a DC volt meter 30 that then gives indication of the incoming signal strength. Meter 30 is preferably a logarithmic type so that is will accurately display the wide range of signal amplitudes presented to it.

In FIG. 4, a first stage in the broad band IF amplifier 28 is made of a pair of differentially connected NPN transistors 22 and 24 having their emitters connected directly together and are supplied by emitter bias current 25 from a current-mirror current source including transistors 27 and 29, and resistors 31 and 33. This first stage also includes collector load resistors 35 and 37.

The IF signal from the AM mixer (not shown in FIG. 4) would be connected to input terminals 39 and 41 of the first IF stage.

A second IF stage 43 of fixed gain is connected in tandem between the first IF stage and a third fixed gain IF stage that is made up of transistors 45 and 47 and resistors 49 and 51. In this third stage emitter resistor 49 provides significant gain degeneration. Bias currents are provided at the emitters of transistors 45 and 47 by current sources 53 and 55.

The IF signal across load resistor 51 of the third IF stage is coupled through an emitter-follower circuit, made up of transistor 57 and resistor 59, and then through a coupling capacitor 60 to the tank circuit 62. The tank 62 and capacitor 60 are series tuned to the IF frequency (usually 450 KHz in scanning AM radios). The IF signal across the tank circuit 62 is detected by the AM detector 64. The net DC value of that detected signal is a measure of the IF carrier at tank circuit 62. In this embodiment the following audio amplifier 65 is a DC coupled circuit passing the DC component representive of the IF carrier amplitude.

The audio signal may be connected to a speaker (not shown) via terminal 66. The DC output component is transferred via the AGC circuit 67 to control the current source that includes transistors 27 and 29. That current source provides the emitter current 25 and thus the gain of the first IF stage. Audio components are essentially eliminated from the AGC signal by shunt capacitor 68.

The above described AM radio portion with AGC is conventional. The added restorer circuit is comprised of the remainder of the circuit elements in the lower part of the diagram in FIG. 4.

The differential IF signal appearing in the third IF stage across emitter resistor 49 is connected to the bases of differentially connected transistors 71 and 72. Variable bias sources comprised of transistors 78 and 79 provide emitter currents respectively to amplifier transistors 71 and 72.

The AGC circuit 67, that controls the gain determining emitter current 25 in the first IF stage, also is connected to the bases of transistors 78 and 79 to control the bias currents in the amplifier including transistors 71 and 72. However, the gain of this stage is not controlled by varying the transconductances of transistors 71 and 72 because of the degenerative emitter resistor 74. The voltage gain of such stages with degenerative emitter resistors is closely approximated by the ratio of the collector load resistance to the emitter resistance. The collector load resistance is the dynamic resistance of the diodes 81, 82, 83 and 84. The resistance of each diode is $(KT/q)(1/I_D)$ where $I_D$ is $I_{86}$ or $I_{87}$. In this manner the AGC signal controls the diode-load bias currents and thus the dynamic resistance of the diode loads in the collectors of transistors 71 and 72. The variable voltage gain of that restorer stage may thus be stated as $$VG_R = A(KT/q)(1/I_{87})(1/R_{74}).$$

The variable voltage gain of the IF stages is $$VG_{IF} = B(q/KT)(I_{25})R_{37}.$$

The letters A and B each represent constants accounting for such constant factors as the fixed gains of the second and third IF stages, and the use here of two diode loads (e.g. 82 and 84) in each collector circuit of the first restorer stage. The differential output of the first restorer stage at the collectors of transistors 71 and 72 is thus an IF signal, $S_R$, that is related to the IF input signal, $S_T$, at the first IF stage by the ratio $$\frac{S_R}{S_T} = (VG_{IF})(VG_R)$$

$$= AB(I_{25}/I_{87})(R_{37}/R_{74}).$$

The gain of the first IF stage is directly proportional to stage bias current 25 and the gain of the restorer is inversely proportional to stage bias current 86 and 87. Thus these gain variable stages have complementary responses to the controlling AGC signal amplitude.

Note that the diode loads 81, 82, 83 and 84 have imposed across them a small RF voltage and thus function as linear loads with respect to the RF signals. Their "resistance" varies only as a function of the AGC signal amplitude.

Figure 2:
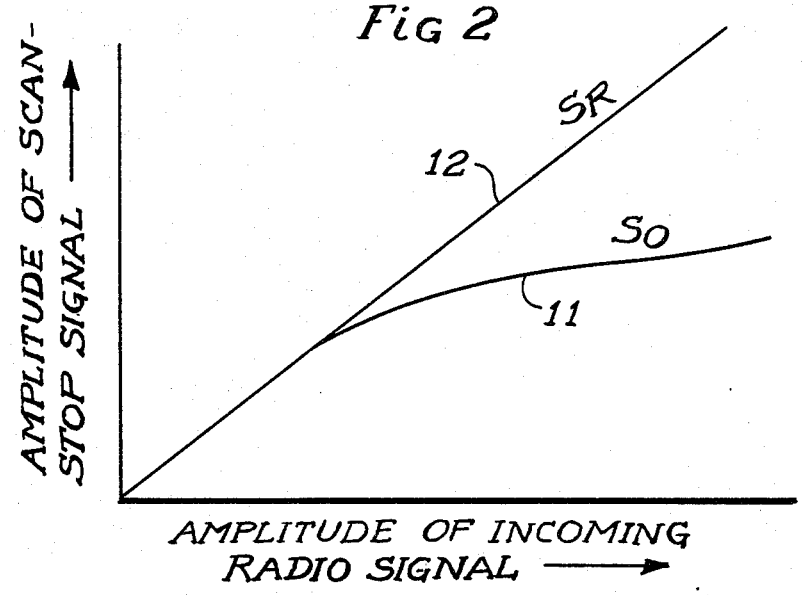
FIG. 2 is a graph of the DC output voltage $S_O$ from the audio amplifier of the receiver of FIG. 1, and the DC output voltage $S_R$ of an adder restorer circuit of this invention, both with respect to the level of the incoming radio signal.

Since both $I_{25}$ and $I_{87}$ (and $I_{86}$) vary directly as the AGC signal, the ratio of output of the restorer $S_R$ and the incoming IF signal, $S_T$ is proportional to the ratio of load resistor $R_{37}$ (and $R_{35}$) and emitter resistor $R_{74}$, both of which are constant. $S_R/S_T$ is therefore constant whatever the strength of the incoming IF signal $S_T$. In other words, $S_R$ is a linear measure of $S_T$ as is illustrated by curve 12 in FIG. 2.

Although the above circuit is preferred, the invention may be practiced in many other ways. For example, the differential input signal $S_M$ to the restorer may be obtained from across added diodes in series with resistors 35 and 37 in the first IF stage, the diodes 81 through 84 in the restorer may be replaced by resistors, the resistor 74 replaced by a short, and a degenerative resistor employed between emitters of transistors 22 and 24. More generally, assuming linear tandem stages, the transfer function of the portion of radio receiver under the influence of an AGC circuit is the complementary transfer function of the restorer circuit under influence of the same AGC circuit such that the product of the two functions is a constant with respect to changes in incoming signal strength.

Still more generally, a transfer function, $T_1$, of the portion of radio receiver between the input of the AGC-gain controlled tandem stage and the down stream point in the signal channel of the tandem stages at which the input of the restorer is connected, whether that radio portion is linear or not, is complementary to the transfer function, $T_2$, of the restorer circuit such that the product $T_1 T_2$ is constant.

Figure 1:
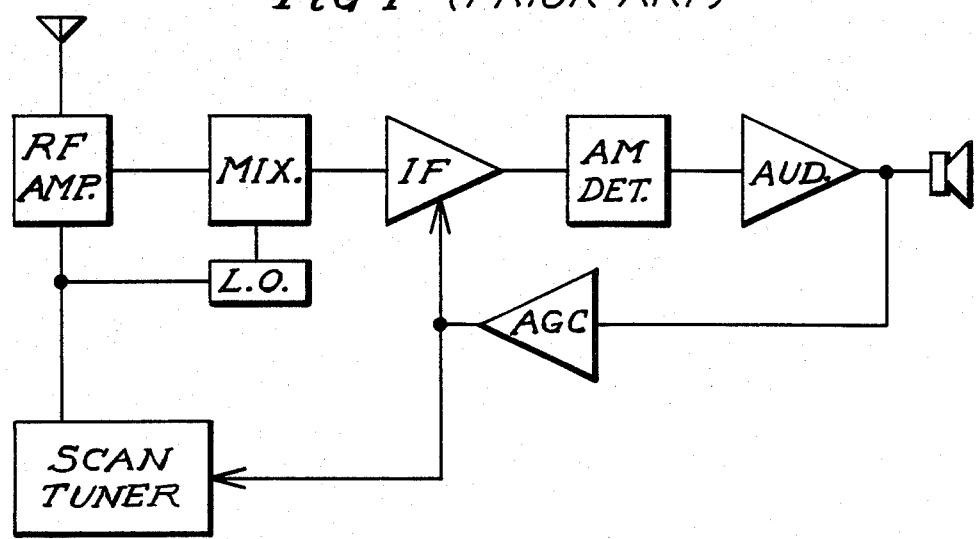
FIG. 1 shows a block diagram of an AM radio receiver with AGC means of the prior art.

The particular circuit described here was designed for implementation almost wholly as one or more integrated circuits with a few discrete components (e.g. tank circuit 62 and capacitor 60) attached. This circuit is also especially suitable for providing a signal (at terminal 89) to a companion automatic scan-tune circuit as shown in the block diagram of FIG. 1, for stopping the scan when a station is received having a signal strength greater than a predetermined value.

The differential output from the collectors of transistors 71 and 72 in restorer circuit 20 is connected directly to the input of the restorer detector 26. Here a linear differential amplifier is made up of differentially connected transistors 91 and 92 with load resistors 93 and 94. A current source supplies a fixed emitter current from transistor 97. The back-to-back transistors 95 and 96 effect full wave rectification of the IF signal $S_R$ appearing at the collectors of transistors 91 and 92. The rectified signal $S_F$ is a DC signal that is proportional to the amplitude of the IF signal $S_M$.

That DC signal is further amplified in the following stages shown in FIG. 4 that constitute the front end of the scan circuit 21. The first stage is made up of transistors 98, 100, 101, 102, 103 and 105. Bias reference currents for the restorer and associated circuits is provided by resistors 109, 110, 111 and 117, and transistors 115 and 116. A current mirror amplifier, comprised of transistors 121 and 122 and resistor 123, is used to invert and deliver that signal as a voltage to terminal 89.

The external capacitor 130 at terminal 89 serves to filter out noise and essentially eliminate the audio components from the stop signal.

The remainder of the scan circuit 21 employed here consists of a standard frequency-synthesizer with micro-processor control. It is programmed to step from one to the next 10 KHz wide band increments including local oscillator 13 in a phase locked loop to control the tuning voltages that effect tuning of the RF stages 10 and the local oscillator 13.

In the particular scan circuit employed here, a "scan stop" signal at terminal 89 is one of amplitude less than 2 volts. The stop signal actually provided at terminal 80 is essentially zero volts (transistor 122 not conducting) when the incoming IF signal $S_T$ at terminals 39 and 41 is at least as large as a predetermined value, here set at 0.5 m.v. in the circuit of FIG. 4.

All of the silicon integrated circuit NPN transistors shown have the same 20 microns squared base-emitter-junction areas. The resistors are all diffused (simultaneously with the transistor base regions) and have values as indicated in the Table 1 below:

TABLE 1

| No. | (Resistors) (ohms) | No. | (ohms) |
|---|---|---|---|
| 31 | 400 | 90 | 1.2K |
| 33 | 400 | 93 | 10K |
| 35 | 1K | 94 | 10K |
| 37 | 1K | 107 | 500 |
| 49 | 1.4K | 109 | 2.4K |
| 51 | 4K | 110 | 3.3K |
| 59 | 1K | 111 | 500 |
| 73 | 400 | 117 | 250 |
| 74 | 1K | 123 | 10K |
| 77 | 400 | | |

The capacitors have values as shown in Table 2.

TABLE 2

| 61 | 100 pf | 68 | 220 μfd |
|---|---|---|---|
| 60 | 12 pf | 130 | 0.1 μfd |

An unregulated positive voltage is supplied to terminal 63 having values any where from 8 to 16 volts. A regulated 5 volts, derived in the integrated circuit chip from the Vcc voltage at terminal 63, appears at terminal 124. Vcc is nominally 12 volts.

Figure 5:
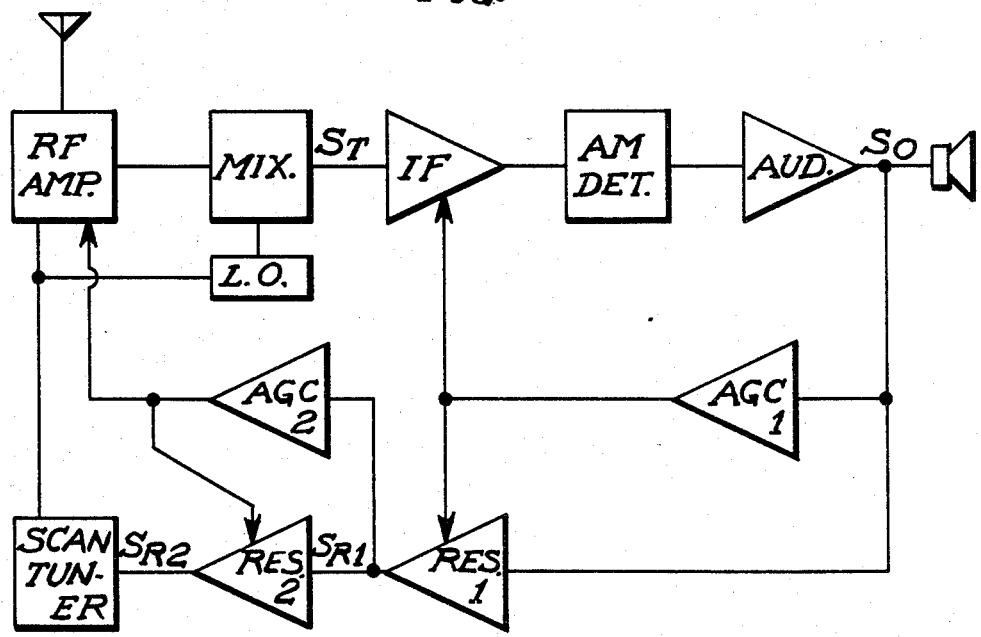
FIG. 5 shows a block diagram of another embodiment of this invention.

The radio of FIG. 5 differs from that of FIG. 3 in two respects. Restorer #1 (having similar position to restorer 20 in FIG. 3) has its input connected to the output of the audio amplifier and the product of the transfer functions of the gain-controlled IF amplifier and of restorer #1 is a constant. Thus the amplitude of $S_{R1}$ is proportional to that of the input signal $S_T$ to the IF amplifier. $S_O$ and therefore $S_{R1}$ are composed of a DC component (and an audio component) and therefore no AM detector is needed following restorer #1.

The second difference is seen to lie in the use of a restorer #2 in tandem with the first restorer #1, and an associated second AGC #2. AGC #2 controls the gain of restorer #2. AGC #2 obtains its input signal $S_{R1}$ from the output $S_{R1}$ of restorer #1. Note that due to the action of AGC #1 and restorer #1 that the amplitude of the IF amplifier input signal $S_T$ and that of the restorer #1 output are directly proportional. The transfer functions of the RF amplifier and of restorer #2 are made complementary so that the RF amplifier is afforded AGC control while the stop signal $S_{R2}$ is made linear with the tuned-in radio signal appearing at the antenna. Note that in this circuit it is only necessary to employ the one AM detector, but filtering must accompany the AGC circuits to get rid of the audio components.

For most purposes, the IF-fed restorer circuit of FIG. 3 will be preferred since some delay will be introduced by the audio amplifier into the restorer output. Also a compromise might be made to more simply AGC control of the RF circuits, namely the use of Signal $S_A$ from AGC circuit 19 to additionally control the RF amplifier gain without adding a second restorer and a second AGC circuit. Such a compromise achieves more thorough AGC control while giving up a part of the linearity of the scan stop signal that was acquired by adding the first restorer (20).

It is additionally comtemplated that if, as is commonly done, the AGC signal is also used to modify the gain of the RF or yet another stage, an additional restorer circuit may be added to compensate for each such additional AGC loop.

What is claimed is:

1. In a radio receiver of the kind that is capable of operating in an analog-gain mode and that includes a plurality of tandem-connected analog-amplifier stages for processing and amplifying a radio signal which may be applied to the input of said tandem stages, and an AGC circuit for automatically altering the gain of at least one of said stages to maintain the output signal from said stages substantially constant for a wide range of amplitudes of said radio signal, the gain of said tandem stages as a function of the output signal from said AGC circuit being a transfer function, $f_2$, the improvement comprising:
   a restorer means having a radio-signal input connected to said output of said tandem stages, said restorer means having an electrically gain-alterable transfer function $f_1$ between said radio-signal input and output thereof and having a control input connected to the output of said AGC circuit, for making the product of said transfer functions $f_1$ and $f_2$ a constant over a wide range of amplitudes of said radio signal.

2. The radio receiver of claim 1 wherein said restorer means includes an amplifier having a non-linear load and a means for establishing and varying a bias current in said load in direct proportion to the magnitude of signal from said output of said AGC circuit.

3. The radio receiver of claim 1 wherein said radio receiver is a superheterodyne AM receiver and said tandem stages are IF stages.

4. The radio receiver of claim 1 wherein said radio receiver is a superheterodyne AM receiver and said at least one of said tandem stages is an RF stage.

5. A superheterodyne AM radio receiver comprising a main channel portion including an IF amplifier, an AM detector and an audio amplifier that are tandem connected in that order, and further comprising an AGC circuit for automatically altering the gain of said IF amplifier to hold the audio output signal at a substantially constant level for a wide range of signal strengths of the received radio signal, and a restorer circuit having a radio-signal input connected to the output of said IF amplifier, having an AGC-signal input connected to the output of said AGC circuit and having a means for altering the gain of said restorer circuit in response to changes in the output signal from said AGC circuit in a complimentary manner with respect to the changes in gain of said IF amplifier whereby the product of the IF amplifier gain and said restorer circuit gain remains constant so that the amplitude of the signal from said restorer circuit output has a fixed relationship with the amplitude of said radio signal at the input of said IF amplifier for a wide range of amplitudes of said radio signal.

6. The radio receiver of claim 5 wherein said IF amplifier includes an amplifying bipolar transistor and one controllable current source for supplying emitter bias current to said transistor, said AGC circuit being connected to said one current source for controlling said emitter current and thus the gain of said stage, said restorer means being comprised of a transistor amplifier having another controllable current source for controlling the collector bias current of said restorer transistor and having a forward biased diode load in the collector circuit of said restorer transistor, said AGC circuit also being connected to said another current source for controlling the bias current in said diode load and thus for varying the gain of said restorer amplifier inversely as and complementary to the gain of said IF amplifier.

7. The radio receiver of claim 5 additionally comprising an automatic scan-tune means for scan tuning the receiver through AM broadcast band frequencies and for stopping the scan at a radio station frequency at which said output of said restorer is greater than a predetermined value.

* * * * *